(12) United States Patent
Wang et al.

(10) Patent No.: US 11,699,982 B2
(45) Date of Patent: Jul. 11, 2023

(54) COIL UNIT DECOUPLING APPARATUS AND MAGNETIC RESONANCE SYSTEM

(71) Applicant: Siemens Healthcare GmbH, Erlangen (DE)

(72) Inventors: JianMin Wang, Shenzhen (CN); Hui Sheng Zhang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/548,926

(22) Filed: Dec. 13, 2021

(65) Prior Publication Data

US 2022/0231656 A1    Jul. 21, 2022

(30) Foreign Application Priority Data

Dec. 15, 2020   (CN) .......................... 202011473453.8

(51) Int. Cl.
*H03H 7/18* (2006.01)

(52) U.S. Cl.
CPC ..................... *H03H 7/18* (2013.01)

(58) Field of Classification Search
CPC ....................................................... H03H 7/18
USPC ...................................................... 333/24 R
See application file for complete search history.

(56) References Cited

U.S. PATENT DOCUMENTS

| 5,708,361 A | 1/1998 | Wang et al. |
| 2006/0006870 A1 | 1/2006 | Wang et al. |
| 2007/0085540 A1 | 4/2007 | Du et al. |
| 2019/0257897 A1 | 8/2019 | Yang et al. |

FOREIGN PATENT DOCUMENTS

| CN | 1941500 A | 4/2007 |
| WO | WO 2013102965 A1 * | 7/2013 |

OTHER PUBLICATIONS

P.B. Roemer et al: "The NMR Phased Array", Magnetic Resonance in Medicine 16, pp. 192-225, 1990.

\* cited by examiner

*Primary Examiner* — Hafizur Rahman
(74) *Attorney, Agent, or Firm* — Banner & Witcoff Ltd.

(57) ABSTRACT

The present disclosure is directed to a coil unit decoupling apparatus and a magnetic resonance system. The apparatus is connected to a first coil unit and a second coil unit in a magnetic resonance system, and is configured to separate, by using a distribution characteristic of a spatial quadrature field between the first coil unit and the second coil unit, a Helmholtz signal and an anti-Helmholtz signal from signals received from the first coil unit and the second coil unit, so as to implement decoupling between the first coil unit and the second coil unit. This facilitates the complexity of decoupling coil units being reduced.

17 Claims, 13 Drawing Sheets

|    | 11 | 12 | 13 | 14 | 15 | 16 | 17 | 18 |
|----|----|----|----|----|----|----|----|----|
| 11 |    | y  | x  | y  | y  | x  | x  | x  |
| 12 |    |    | y  | x  | x  | y  | x  | x  |
| 13 |    |    |    | y  | x  | x  | y  | x  |
| 14 |    |    |    |    | x  | x  | x  | y  |
| 15 |    |    |    |    |    | y  | x  | y  |
| 16 |    |    |    |    |    |    | y  | x  |
| 17 |    |    |    |    |    |    |    | y  |
| 18 |    |    |    |    |    |    |    |    |

*Fig. 2*

|    | 11 | 12 | 13 | 14 | 15 | 16 | 17 | 18 |
|----|----|----|----|----|----|----|----|----|
| 11 |    | y  | x  | y  | y  | y  | x  | x  |
| 12 |    |    | y  | y  | x  | y  | y  | x  |
| 13 |    |    |    | y  | x  | x  | y  | y  |
| 14 |    |    |    |    | y  | x  | x  | y  |
| 15 |    |    |    |    |    | y  | x  | y  |
| 16 |    |    |    |    |    |    | y  | x  |
| 17 |    |    |    |    |    |    |    | y  |
| 18 |    |    |    |    |    |    |    |    |

*Fig. 4*

COIL UNIT DECOUPLING APPARATUS AND MAGNETIC RESONANCE SYSTEM

CROSS-REFERENCE TO RELATED APPLICATIONS

The present application claims the benefit of the filing date of China patent application no. CN 202011473453.8, filed on Dec. 15, 2020, the contents of which are incorporated herein by reference in their entirety.

TECHNICAL FIELD

The present disclosure relates to magnetic resonance (MR) systems and, in particular, to a coil unit decoupling apparatus and a magnetic resonance system.

BACKGROUND

In a magnetic resonance (MR) system, particularly in a low-field MR system, the coupling between coil units is a very important issue. For a low-field MR system, the coupling between coil units that are far away from each other cannot be ignored due to a high Q factor of the coil units.

To implement decoupling between any coil units, many solutions have been proposed. The most common decoupling technique is to cancel out magnetic fields in the positive and negative directions in an overlapping manner. If overlapping-based decoupling is not feasible, inductive decoupling or capacitive decoupling is used. Another method is to implement strong decoupling of up to three or four coil units using cross capacitors. Recently, a method for decoupling coil units using end rings has also been proposed. However, each of these decoupling methods require complex adjustments during the manufacturing process. In addition, because a wire length of coil units and the loss of inductors are increased in these methods, additional signal-to-noise ratio losses are also caused.

FIG. 1 is a schematic diagram of eight typical coil units distributed on the surface of a cylinder, in which there are a total of two layers: a top layer and a bottom layer, and each layer has four coil units, i.e., coil units 11 to 14 at the top layer, and coil units 15 to 18 at the bottom layer. Taking the coil unit 11 as an example, the coil unit 11 can be easily decoupled from the coil units 12, 14, and 15 by means of coil overlapping. However, since the coil unit 11 is not adjacent to the coil units 13, 16, 17, and 18, it is difficult to decouple from the coil units 13, 16, 17, and 18. Therefore, four decoupling circuits will be used to decouple the coil unit 11 from all other coil units. To completely decouple all the coil units from each other, a total of 8*4/2=16 decoupling circuits are required.

FIG. 2 shows a way of decoupling between the eight coil units shown in FIG. 1, in which y indicates that decoupling (in addition to overlapping) may be performed in each case, and x indicates that decoupling (in addition to overlapping) must be performed in each case. For example, overlapping-based decoupling y is used between the coil unit 11 and the coil units 12, 14, and 15, and circuit-based decoupling x needs to be used between the coil unit 11 and the coil units 13, 16, 17, and 18.

Still another method is to move coil units at one layer horizontally by half a coil width, that is, rotate the coil units horizontally by 45 degrees. As shown in FIG. 3, the coil units 11 to 14 at the top layer in FIG. 1 are rotated horizontally by 45 degrees, to implement overlapping-based decoupling between the coil units 11 and 15 and between the coil units 11 and 16. In this way, the number of decoupling circuits may be reduced to 12, as shown in FIG. 4. However, the symmetry between the coil units at the top layer and the bottom layer is broken. As a result, parallel imaging quality is reduced. In addition, it is very difficult to decouple 12 coil units.

SUMMARY

In view of this, the embodiments of the present disclosure provide a coil unit decoupling apparatus and an MR system to reduce the complexity of decoupling coil units in an MR system.

The technical solutions of the embodiments of the present disclosure are implemented as follows.

A coil unit decoupling apparatus is provided. The apparatus is connected to a first coil unit and a second coil unit in a magnetic resonance system, and is configured to separate, by using a distribution characteristic of a spatial quadrature field between the first coil unit and the second coil unit, a Helmholtz signal and an anti-Helmholtz signal from signals received from the first coil unit and the second coil unit, so as to implement decoupling between the first coil unit and the second coil unit.

The apparatus includes: a first phase-shift circuit, a second phase-shift circuit, and a combiner, wherein:

a first connection terminal of the first phase-shift circuit is connected to a first port of the first coil unit;

a second connection terminal of the first phase-shift circuit is connected to a first connection terminal of the combiner;

a second connection terminal of the combiner is connected to a first connection terminal of the second phase-shift circuit;

a second connection terminal of the second phase-shift circuit is connected to a first port of the second coil unit; and the sum of phase differences between the first phase-shift circuit, the combiner, and the second phase-shift circuit is 180 degrees or −180 degrees.

The first phase-shift circuit includes: a first capacitor, a second capacitor, a first inductor, and a third capacitor, wherein:

a first connection terminal of the first capacitor is connected to the first port of the first coil unit;

a second connection terminal of the first capacitor is connected to a first connection terminal of the second capacitor and a first connection terminal of the first inductor;

a second connection terminal of the first inductor is connected to a first connection terminal of the third capacitor;

a second connection terminal of the third capacitor is grounded; and a second connection terminal of the second capacitor is connected to the first connection terminal of the combiner.

The first phase-shift circuit further includes: a fourth capacitor, a fifth capacitor, and a sixth capacitor, wherein:

the fourth capacitor is connected in parallel across the first capacitor, the fifth capacitor is connected in parallel across the second capacitor, and the sixth capacitor is connected in parallel across the third capacitor;

alternatively, the first phase-shift circuit further includes: a fourth capacitor, a fifth capacitor, a sixth capacitor, and a seventh capacitor, wherein:

the fourth capacitor is connected in parallel across the first capacitor, the fifth capacitor is connected in parallel across the second capacitor, and the sixth capacitor and the seventh capacitor are respectively connected in parallel across the third capacitor.

The second phase-shift circuit includes: an eighth capacitor, a second inductor, and a ninth capacitor, wherein:

a first connection terminal of the eighth capacitor is connected to the second connection terminal of the combiner and a first connection terminal of the second inductor;

a second connection terminal of the eighth capacitor is grounded;

a second connection terminal of the second inductor is connected to a first connection terminal of the ninth capacitor and the first port of the second coil unit; and a second connection terminal of the ninth capacitor is grounded.

The second phase-shift circuit further includes: a tenth capacitor and an eleventh capacitor, wherein:

the tenth capacitor is connected in parallel across the eighth capacitor, and the eleventh capacitor is connected in parallel across the ninth capacitor.

The combiner includes: a twelfth capacitor, a third inductor, a fourth inductor, and a thirteenth capacitor, wherein:

a first connection terminal of the twelfth capacitor is connected to the second connection terminal of the first phase-shift circuit and a first connection terminal of the fourth inductor;

a second connection terminal of the twelfth capacitor is connected to a first connection terminal of the third inductor;

a second connection terminal of the third inductor is connected to a first connection terminal of the thirteenth capacitor and the first connection terminal of the second phase-shift circuit; and a second connection terminal of the thirteenth capacitor is connected to a second connection terminal of the fourth inductor.

A phase difference between the second connection terminal of the twelfth capacitor and the first port of the first coil unit is a first phase difference, a phase difference between the second connection terminal of the twelfth capacitor and the first port of the second coil unit is a second phase difference, and the difference between the first phase difference and the second phase difference is 180 degrees or −180 degrees.

The attenuation between the second connection terminal of the twelfth capacitor and the first port of the first coil unit is equal to the attenuation between the second connection terminal of the twelfth capacitor and the first port of the second coil unit.

The first coil unit and the second coil unit satisfy the condition of being symmetrical with respect to a plane.

A port in the apparatus that is used for outputting an anti-Helmholtz signal is connected to a fourteenth capacitor to eliminate coupling with another anti-Helmholtz signal.

A magnetic resonance system is provided, which includes a coil unit decoupling apparatus as described in any one of the above embodiments.

In the embodiments of the present disclosure, the first coil unit and the second coil unit in the MR system are connected to the coil unit decoupling apparatus. The apparatus is configured to separate, by using a distribution characteristic of a spatial quadrature field between the first coil unit and the second coil unit, a Helmholtz signal and an anti-Helmholtz signal from signals received from the first coil unit and the second coil unit, so as to implement decoupling between the first coil unit and the second coil unit, thereby reducing the complexity of decoupling the coil units.

BRIEF DESCRIPTION OF THE DRAWINGS/FIGURES

The above and other features and advantages of the present disclosure will be more apparent to those of ordinary skill in the art from the detailed description of preferred embodiments of the present disclosure with reference to the accompanying drawings, in which:

FIG. 2 is a schematic diagram of an existing way of decoupling between the eight coil units shown in FIG. 1;

Figure 1:
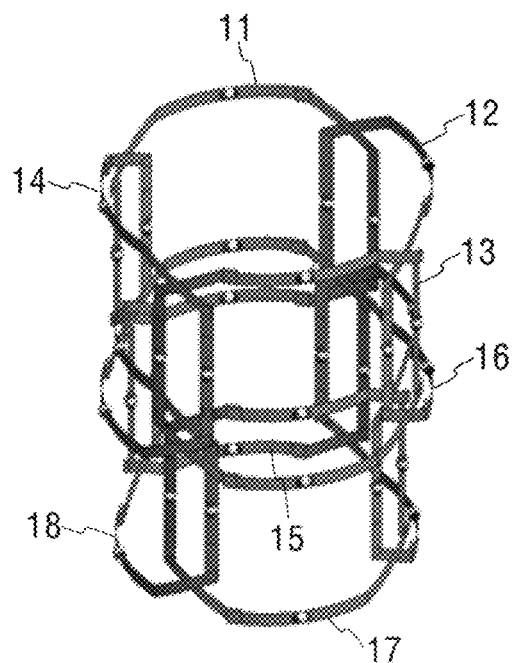
FIG. 1 is an example schematic diagram of eight typical coil units distributed on the surface of a cylinder.
Figure 3:
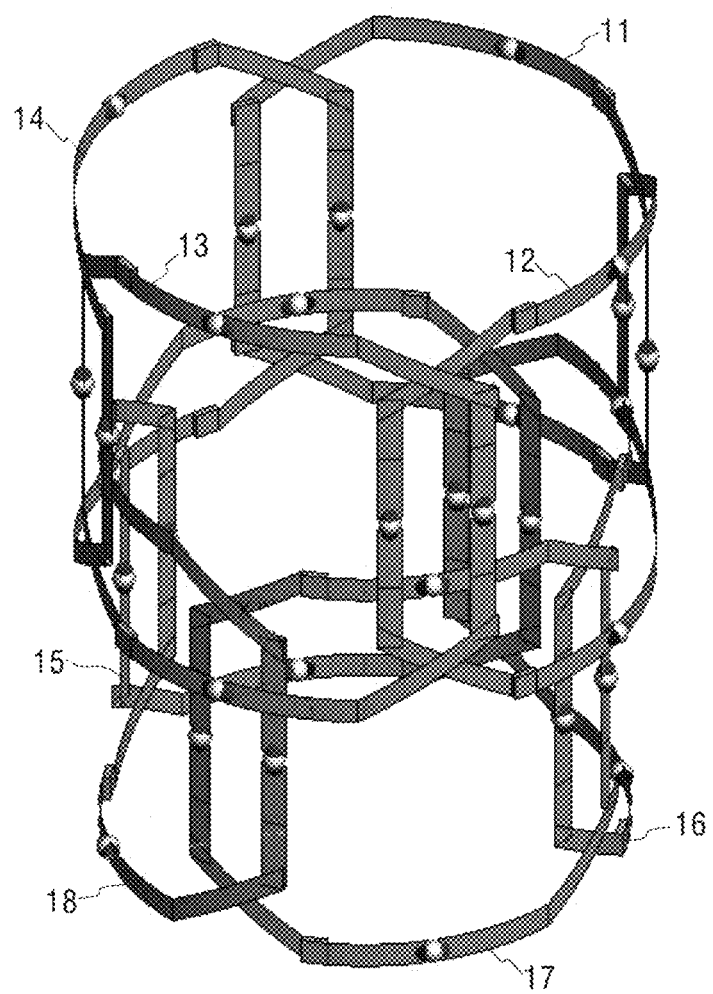
Figure 5:
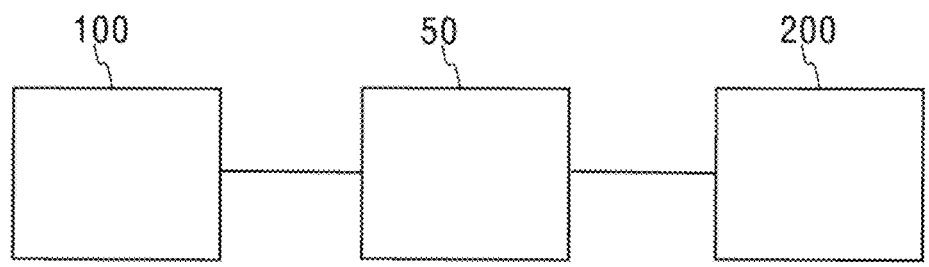
Figure 6:
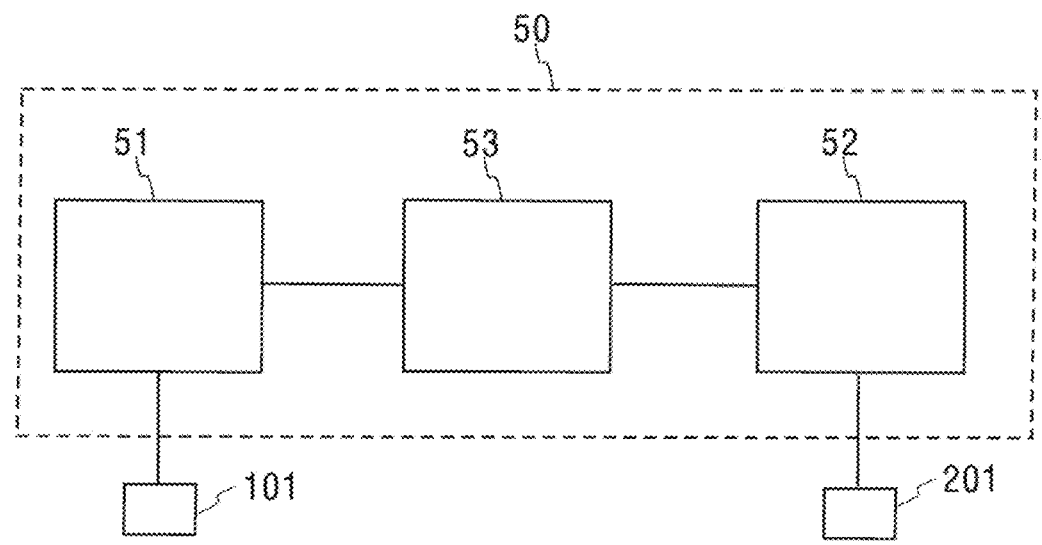
Figure 7:
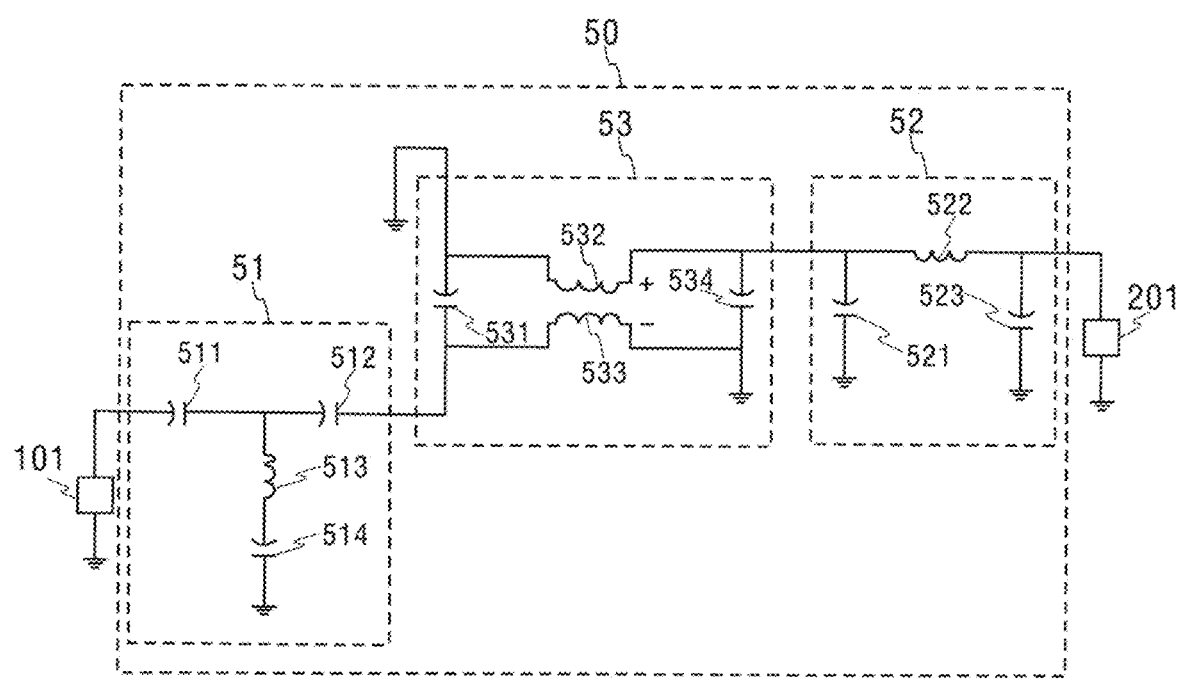
Figure 8:
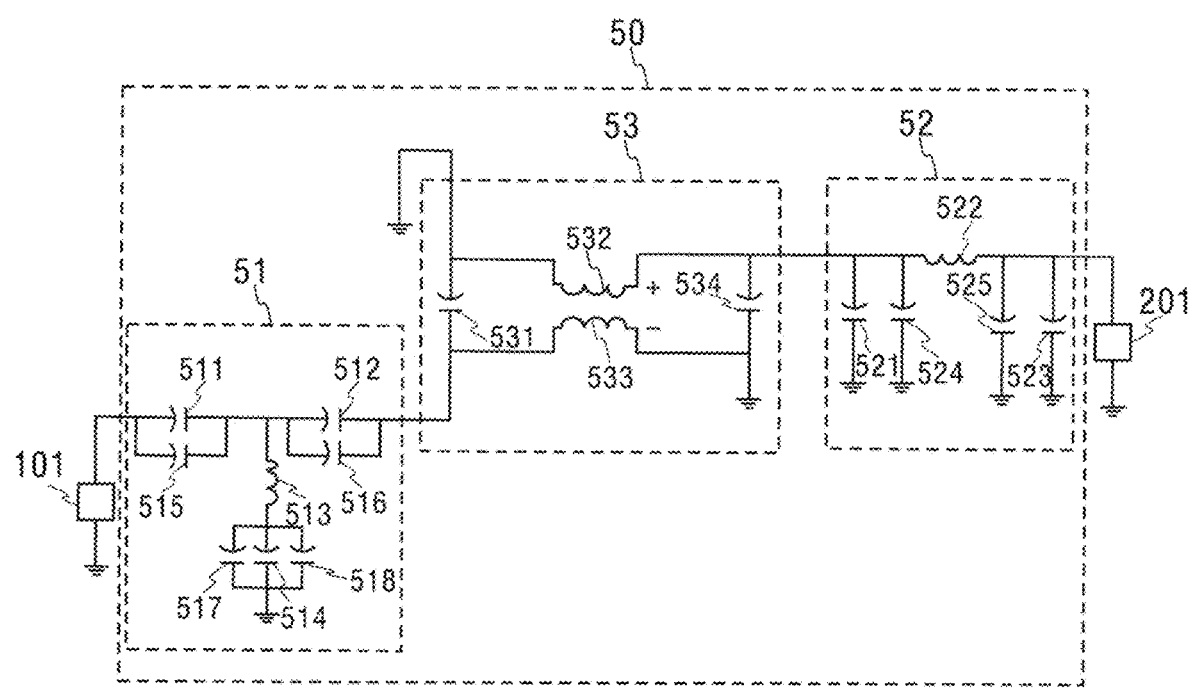
Figure 9:
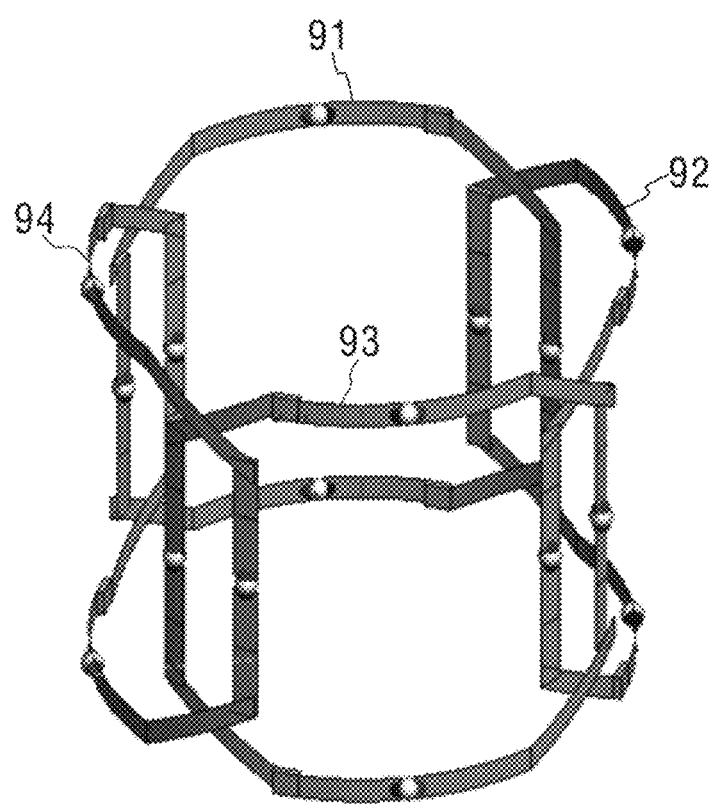
Figure 10:
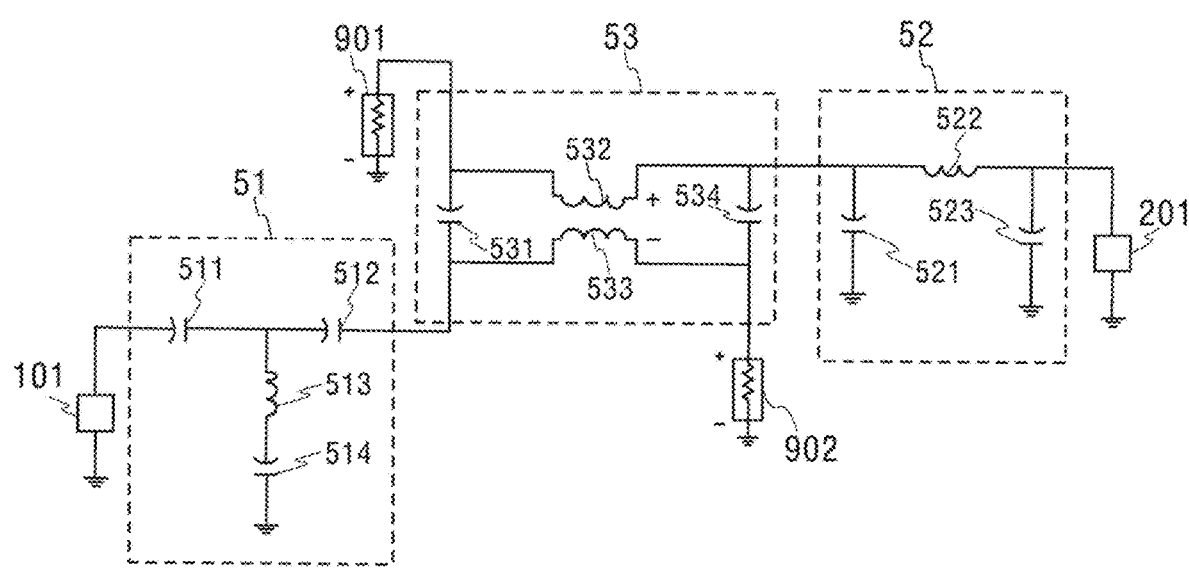
Figure 11:
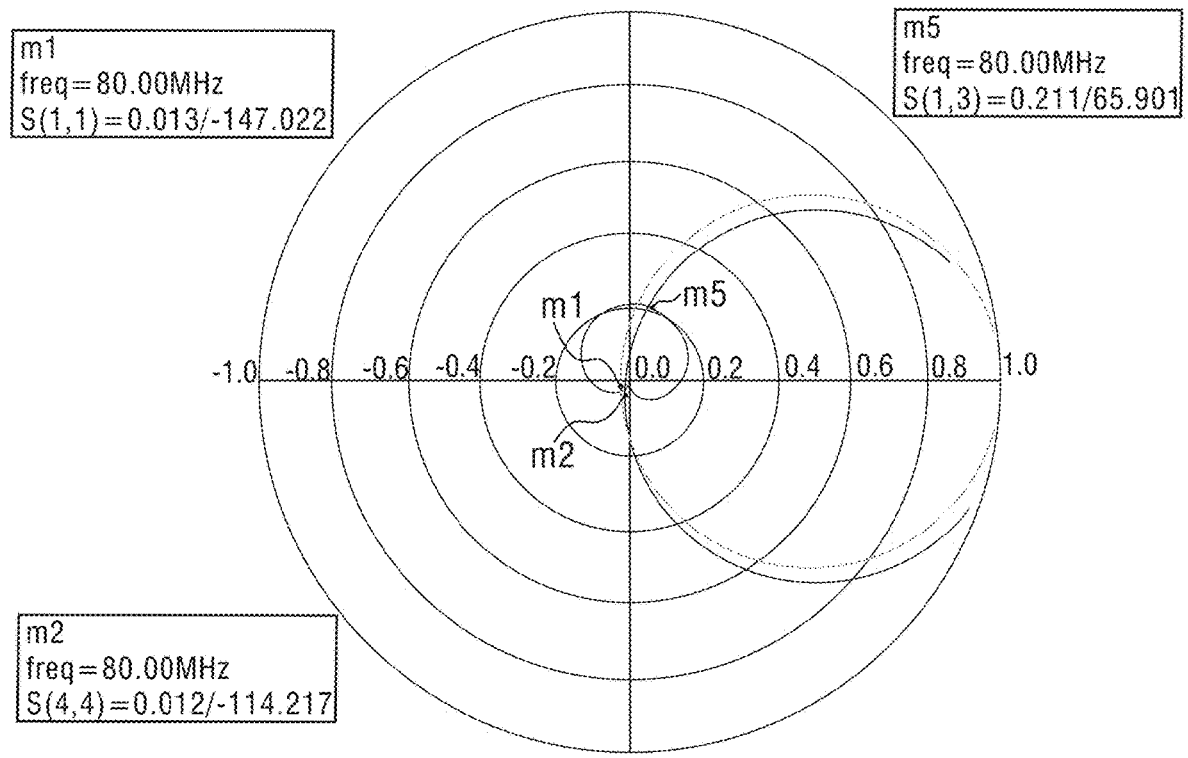
Figure 12:
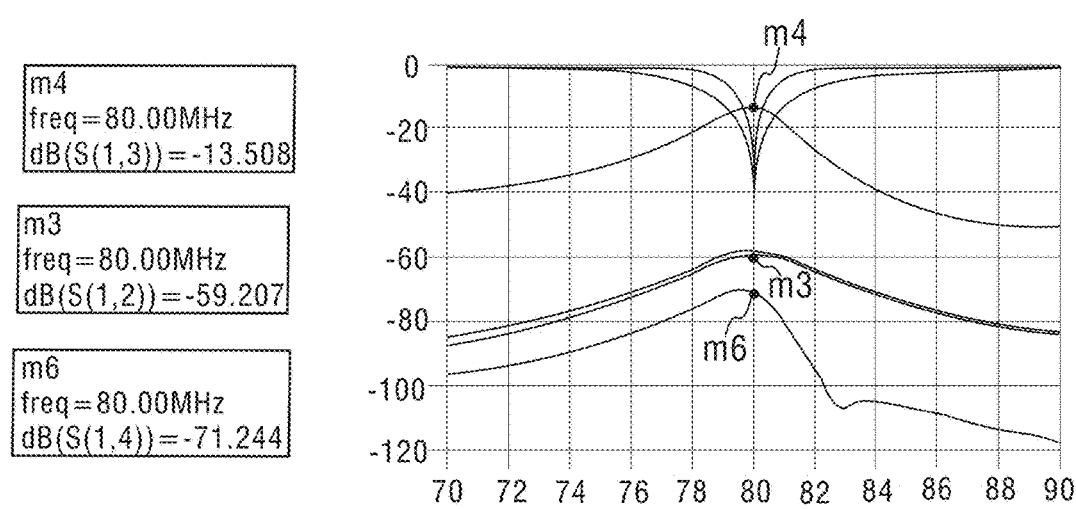
Figure 13:
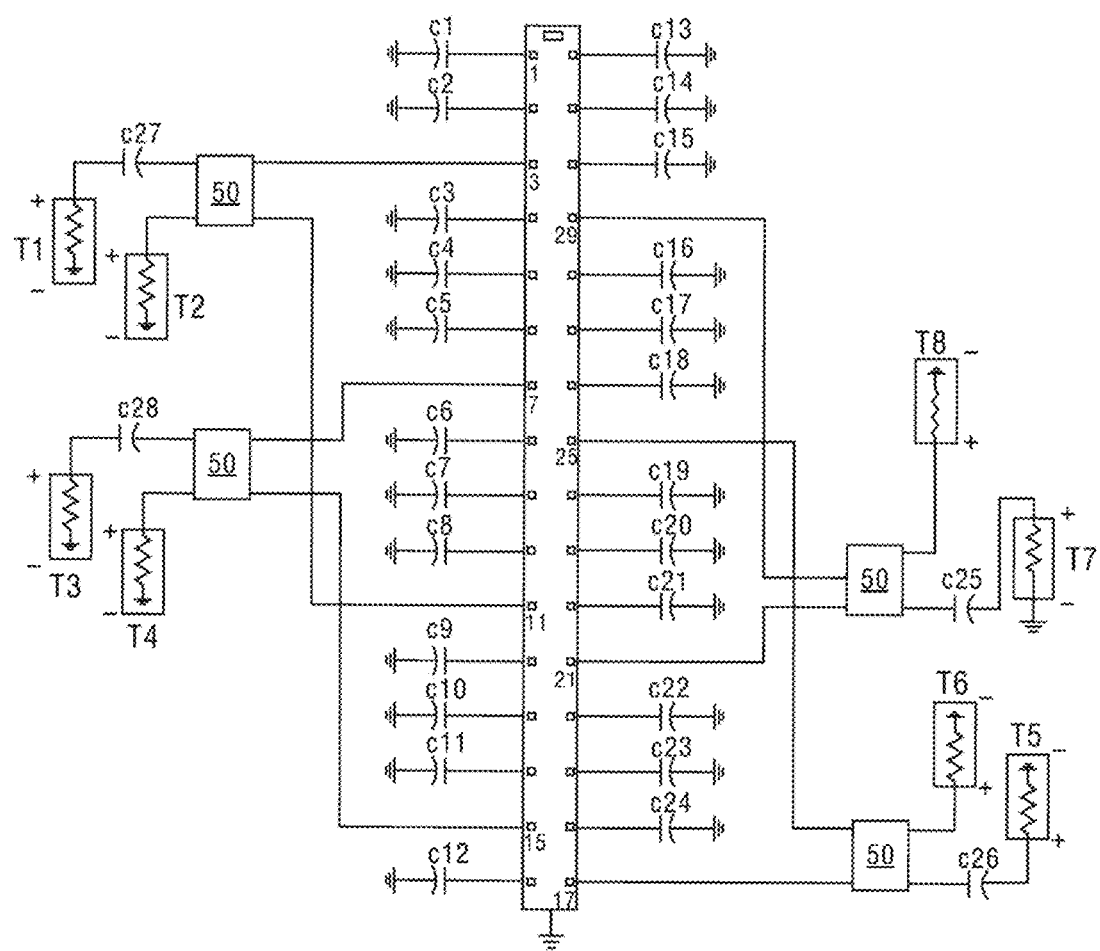
Figure 14:
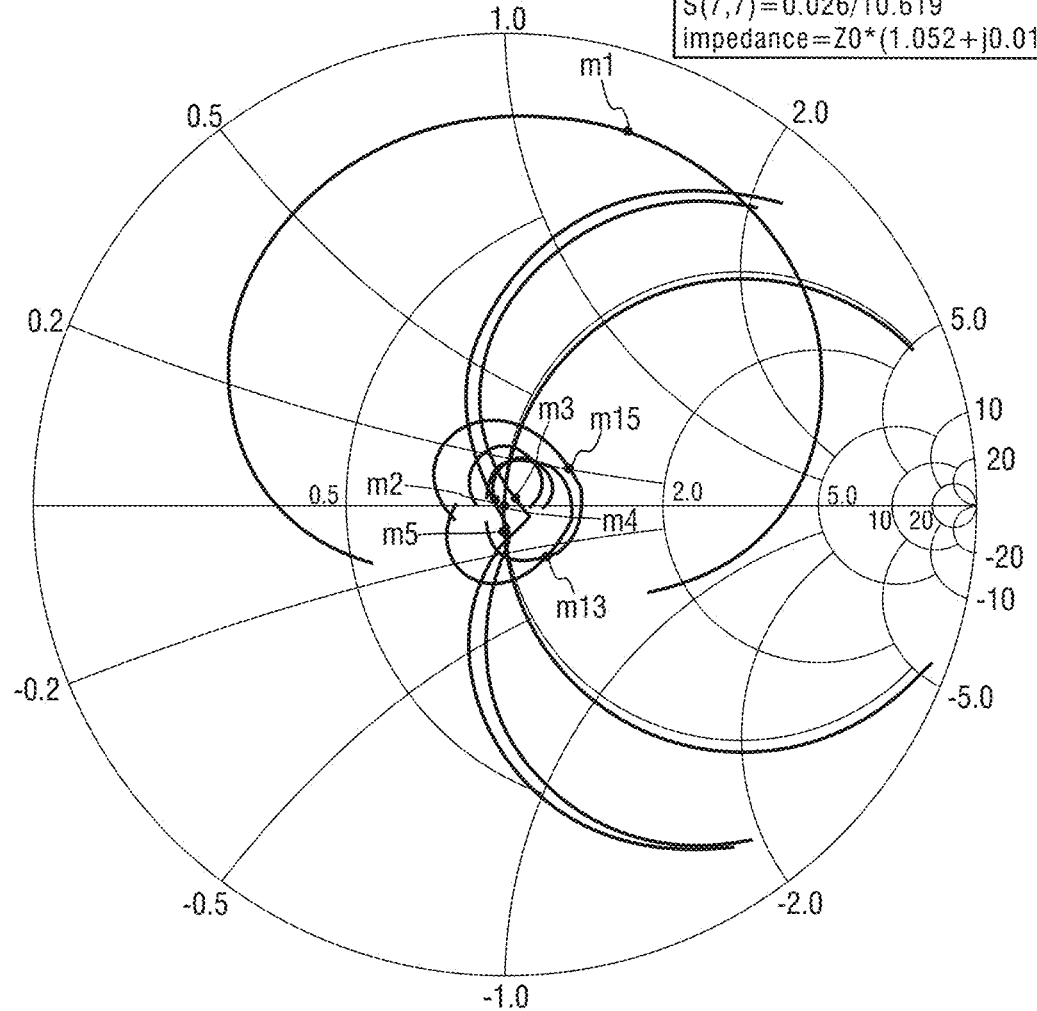
Figure 15:
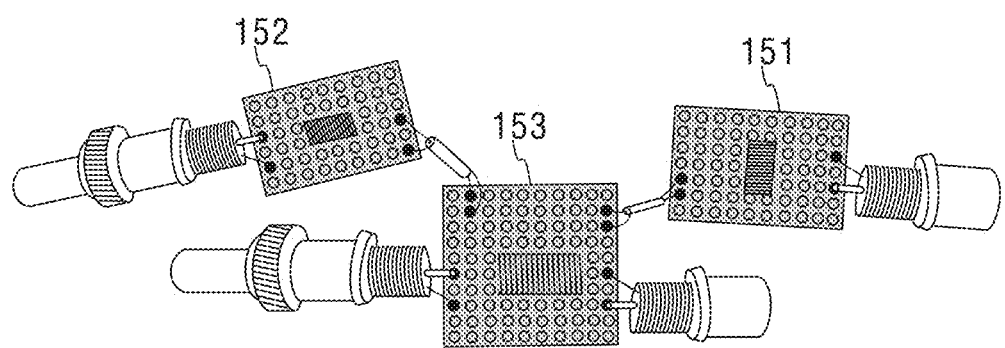

FIG. 3 is a schematic diagram of an existing way of overlapping-based decoupling between the coil units 1 and 5 and between the coil units 1 and 6 by horizontally rotating the coil units 1 to 4 in the first row in FIG. 1 by 45 degrees;

FIG. 4 is a schematic diagram of an existing way of decoupling between the eight coil units shown in FIG. 3;

FIG. 5 is a schematic diagram of an example coil unit decoupling apparatus according to an embodiment of the present disclosure;

FIG. 6 is a schematic structural diagram of an example coil unit decoupling apparatus according to an embodiment of the present disclosure;

FIG. 7 is a structural diagram of an example coil unit decoupling apparatus according to another embodiment of the present disclosure;

FIG. 8 is a structural diagram of an example coil unit decoupling apparatus according to still another embodiment of the present disclosure;

FIG. 9 is a schematic diagram of an example of four coil units distributed on the surface of a cylinder in an application example of the present disclosure;

FIG. 10 is a schematic diagram of simulation by connecting a coil unit decoupling apparatus between coil units 91 and 93 shown in FIG. 9;

FIG. 11 is a schematic diagram of an example of port matching and decoupling effect achieved by performing, using simulation software, field simulation on the coil units shown in FIG. 9 to which a coil unit decoupling apparatus according to an embodiment of the present disclosure has been applied;

FIG. 12 is a schematic diagram of a decoupling effect (unit: dB) achieved by performing field simulation on the coil units shown in FIG. 9 to which a coil unit decoupling apparatus according to an embodiment of the present disclosure has been applied;

FIG. 13 is a diagram of a structure for simulation of decoupling the eight coil units, as shown in FIG. 1, in an MR system by using a coil unit decoupling apparatus according to an embodiment of the present disclosure;

FIG. 14 is a schematic diagram of a simulation result of the structure shown in FIG. 13; and FIG. 15 is a diagram of an example application of a coil unit decoupling apparatus according to an embodiment of the present disclosure, which is connected between two coil units.

Reference numerals in the accompanying drawings are as follows:

| Reference numeral | Meaning |
| --- | --- |
| 11-18 | Coil unit |
| 50 | Coil unit decoupling apparatus according to embodiments of the present disclosure |

-continued

| Reference numeral | Meaning |
| --- | --- |
| 100 | First coil unit |
| 200 | Second coil unit |
| 51 | First phase-shift circuit |
| 52 | Second phase-shift circuit |
| 53 | Combiner |
| 101 | First port of first coil unit |
| 201 | First port of second coil unit |
| 511 | First capacitor |
| 512 | Second capacitor |
| 513 | First inductor |
| 514 | Third capacitor |
| 515 | Fourth capacitor |
| 516 | Fifth capacitor |
| 517 | Sixth capacitor |
| 518 | Seventh capacitor |
| 521 | Eighth capacitor |
| 522 | Second inductor |
| 523 | Ninth capacitor |
| 524 | Tenth capacitor |
| 525 | Eleventh capacitor |
| 531 | Twelfth capacitor |
| 532 | Third inductor |
| 533 | Fourth inductor |
| 534 | Thirteenth capacitor |
| 91~94 | Coil unit |
| 901 | First simulation port |
| 902 | Second simulation port |
| 151 | First phase-shift circuit |
| 152 | Second phase-shift circuit |
| 153 | Combiner |

DETAILED DESCRIPTION

In order to make the objectives, technical solutions, and advantages of the present disclosure more apparent, the present disclosure will be described in further detail by way of embodiments hereinafter.

FIG. 5 is a schematic diagram of a coil unit decoupling apparatus 50 according to an embodiment of the present disclosure. The apparatus 50 is respectively connected to a first coil unit 100 and a second coil unit 200 in an MR system, and is configured to separate, by using a distribution characteristic of a spatial quadrature field between the first coil unit 100 and the second coil unit 200, a Helmholtz signal and an anti-Helmholtz signal from signals received from the first coil unit 100 and the second coil unit 200, so as to implement decoupling between the first coil unit 100 and the second coil unit 200.

In the foregoing embodiment, the first coil unit and the second coil unit in the MR system are connected to the coil unit decoupling apparatus. The coil unit decoupling apparatus is configured to separate, by using a distribution characteristic of a spatial quadrature field between the first coil unit and the second coil unit, a Helmholtz signal and an anti-Helmholtz signal from signals received from the first coil unit and the second coil unit, so as to implement decoupling between the first coil unit and the second coil unit, thereby reducing the complexity of decoupling the coil units.

FIG. 6 is a schematic structural diagram of a coil unit decoupling apparatus 50 according to an embodiment of the present disclosure. The coil unit decoupling apparatus 50 mainly includes: a first phase-shift circuit 51, a second phase-shift circuit 52, and a combiner 53.

I). A first connection terminal of the first phase-shift circuit 51 is connected to a first port 101 of a first coil unit in an MR system; and a second connection terminal of the first phase-shift circuit 51 is connected to a first connection terminal of the combiner 53, wherein the first port of the first coil unit is any port of the first coil unit. Generally, there are a plurality of ports for connecting capacitors in each loop of coil units, and any one of the ports may be selected as the first port 101.

II). A second connection terminal of the combiner 53 is connected to a first connection terminal of the second phase-shift circuit 52.

III). A second connection terminal of the second phase-shift circuit 52 is connected to a first port 201 of a second coil unit in the MR system, wherein the first port of the second coil unit is any port of the second coil unit. Generally, there are a plurality of ports for connecting capacitors in each loop of coil units, and any one of the ports may be selected as the first port 201.

The first coil unit and the second coil unit satisfy the condition of being symmetrical with respect to a plane. The sum of phase differences between the first phase-shift circuit 51, the combiner 53, and the second phase-shift circuit 52 is 180 degrees or −180 degrees.

In the foregoing embodiment, the decoupling apparatus with a phase difference of 180 degrees or −180 degrees is connected between the first coil unit and the second coil unit in the MR system, so as to implement decoupling between the first coil unit and the second coil unit easily, thereby reducing the decoupling complexity.

In actual application, the coil unit decoupling apparatus provided in the embodiment of the present disclosure needs to be connected only between every two coil units in the MR system that are symmetrical with respect to a plane. For example, in a coil unit structure shown in FIG. 1, a coil unit decoupling apparatus needs to be connected only between the coil units 1 and 3, 2 and 4, 5 and 7, as well as 6 and 8, respectively, in which case a total of only four decoupling apparatuses are required. It can be seen that the complexity is greatly reduced.

FIG. 7 is a schematic structural diagram of a coil unit decoupling apparatus 50 according to another embodiment of the present disclosure. The coil unit decoupling apparatus 50 mainly includes: a first phase-shift circuit 51, a second phase-shift circuit 52, and a combiner 53.

I). The first phase-shift circuit 51 includes: a first capacitor 511, a second capacitor 512, a first inductor 513, and a third capacitor 514, wherein:

a first connection terminal of the first capacitor 511 is connected to a first port 101 of a first coil unit 100 in an MR system;

a second connection terminal of the first capacitor 511 is connected to a first connection terminal of the second capacitor 512 and a first connection terminal of the first inductor 513;

a second connection terminal of the first inductor 513 is connected to a first connection terminal of the third capacitor 514;

a second connection terminal of the third capacitor 514 is grounded; and a second connection terminal of the second capacitor 512 is connected to a first connection terminal of the combiner 53.

II). The second phase-shift circuit 52 includes: an eighth capacitor 521, a second inductor 522, and a ninth capacitor 523, wherein:

a first connection terminal of the eighth capacitor 521 is connected to a second connection terminal of the combiner 53 and a first connection terminal of the second inductor 522;

a second connection terminal of the eighth capacitor 521 is grounded;

a second connection terminal of the second inductor 522 is connected to a first connection terminal of the ninth capacitor 523 and a first port 201 of a second coil unit in the MR system; and a second connection terminal of the ninth capacitor 523 is grounded.

III). The combiner 53 includes: a twelfth capacitor 531, a third inductor 532, a fourth inductor 533, and a thirteenth capacitor 534, wherein:

a first connection terminal of the twelfth capacitor 531 is connected to a second connection terminal of the first phase-shift circuit and a first connection terminal of the fourth inductor 533;

a second connection terminal of the twelfth capacitor 531 is connected to a first connection terminal of the third inductor 532;

a second connection terminal of the third inductor 532 is connected to a first connection terminal of the thirteenth capacitor 534 and a first connection terminal of the second phase-shift circuit; and a second connection terminal of the thirteenth capacitor 534 is connected to a second connection terminal of the fourth inductor 533.

Assuming that a phase difference between the second connection terminal of the twelfth capacitor 531 and the first port 101 of the first coil unit is a first phase difference, and a phase difference between the second connection terminal of the twelfth capacitor 531 and the first port 201 of the second coil unit is a second phase difference, the difference between the first phase difference and the second phase difference is 180 degrees or −180 degrees. The setting of a capacitance value of each capacitor and an inductance value of each inductor in the coil unit decoupling apparatus 50 only needs to satisfy the condition that the difference between the first phase difference and the second phase difference is 180 degrees or −180 degrees.

In addition, in actual application, it can be further considered that the setting of a capacitance value of each capacitor and an inductance value of each inductor in the coil unit decoupling apparatus 50 satisfies the condition that the attenuation between the second connection terminal of the twelfth capacitor 531 and the first port 101 of the first coil unit is equal to the attenuation between the second connection terminal of the twelfth capacitor 531 and the first port 201 of the second coil unit, where the attenuation is generally 3 decibels (dB).

FIG. 8 is a schematic structural diagram of a coil unit decoupling apparatus 50 according to another embodiment of the present disclosure. The apparatus has the following elements added therein in comparison with the apparatus shown in FIG. 7.

I). The first phase-shift circuit 51 has added therein: a fourth capacitor 515, a fifth capacitor 516, and a sixth capacitor 517, wherein:

the fourth capacitor 515 is connected in parallel across the first capacitor 511, the fifth capacitor 516 is connected in parallel across the second capacitor 512, and the sixth capacitor 517 is connected in parallel across the third capacitor 514.

In actual application, the first phase-shift circuit 51 may further include: a seventh capacitor 518, which is connected in parallel across the third capacitor 514.

II). The second phase-shift circuit 52 has added therein: a tenth capacitor 524 and an eleventh capacitor 525, wherein:

the tenth capacitor 524 is connected in parallel across the eighth capacitor 521, and the eleventh capacitor 525 is connected in parallel across the ninth capacitor 523.

Application examples of the present disclosure are provided as follows.

FIG. 9 shows four coil units in an MR system that are distributed on the surface of a cylinder, in which coil units 91 and 93 are symmetrical with respect to a central vertical section of the cylinder, and coil units 92 and 94 are symmetrical with respect to the central vertical section of the cylinder. Therefore, it is impossible to implement overlapping-based decoupling between 91 and 93 and between 92 and 94. The coil unit decoupling apparatus provided in the embodiment of the present disclosure is connected between 91 and 93 and between 92 and 94.

FIG. 10 is a schematic diagram of a simulation by connecting a coil unit decoupling apparatus between the coil units 91 and 93, in which 101 denotes a first port of the coil unit 91, and 201 denotes a first port of the coil unit 93. 901 denotes a first simulation port, and 902 denotes a second simulation port, that is, 901 is connected to a first connection terminal of a third inductor 532, and 902 is connected to a second connection terminal of a fourth inductor 533. Here, 901 is set to be in an anti-Helmholtz (hereinafter referred to as AH) mode, that is, 901 inputs or outputs an AH signal. 902 is set to be in a Helmholtz (hereinafter referred to as H) mode, that is, 902 inputs or outputs an H signal.

Similarly, the coil unit decoupling apparatus connected between the coil units 92 and 94 is also provided with two simulation ports, which are respectively set to be a third simulation port and a fourth simulation port, where the third simulation port is connected to the first connection terminal of the third inductor 532 in the decoupling apparatus, and the fourth simulation port is connected to the second connection terminal of the fourth inductor 533 in the decoupling apparatus. The third simulation port is set to be in the AH mode, and the fourth simulation port is set to be in the H mode.

FIG. 11 is a schematic diagram of a port matching and decoupling effect achieved by performing, using simulation software, field simulation on the coil units shown in FIG. 9 to which a coil unit decoupling apparatus according to an embodiment of the present disclosure has been applied. After the coil unit decoupling apparatus is respectively connected between the coil units 91 and 93 and between 92 and 94, capacitors in a loop of coil units 91 to 94 are adjusted to maintain the frequency of the coil units at 80 MHz. In FIG. 11, m1 denotes a reflection parameter of an AH signal on a first simulation port, m2 denotes a reflection parameter of an H signal on a fourth simulation port, and m5 denotes a reflection parameter of an AH signal (used for describing a decoupling effect of a third simulation port and the first simulation port) input from the third simulation port and coupled to the first simulation port for output, where the amplitudes and phases of the signals corresponding to m1, m2, and m5 are denoted by S(1,1), S(4,4), and S(1,3), respectively. As shown in FIG. 11, S(1,1)=0.013/−147.022, S(4,4)=0.012/−114.217, and S(1,3)=0.211/65.901, where 0.013, 0.012, and 0.211 respectively denote the amplitudes, and −147.022, −114.217, and 65.901 respectively denote the phases.

FIG. 12 is a schematic diagram of a decoupling effect (unit: dB) achieved by performing field simulation on the coil units shown in FIG. 9 to which a coil unit decoupling apparatus according to an embodiment of the present disclosure has been applied, in which m3 denotes the degree of coupling between a second simulation port and a first simulation port, m4 denotes the degree of coupling between a third simulation port and the first simulation port, and m6 denotes the degree of coupling between a fourth simulation port and the first simulation port.

It can be seen from FIG. 11 and FIG. 12 that:

I). Owing to symmetry, a good decoupling effect is achieved between signals in the H mode and between signals in the H mode and AH mode. For example, S(4,4)=0.012/−114.217 in FIG. 11 corresponds to the degree of coupling between the signals in the H mode, and dB(S(1,4))=−71.244 and dB(S(1,2))=−59.207 in FIG. 12 correspond to the degrees of coupling between the signals in the H mode and AH mode. It can be seen that the degrees of coupling all have relatively small values.

II). A decoupling effect between the signals in the AH mode and AH mode is poor, such as S(1,3)=0.211/65.901 in FIG. 11 and dB(S(1,3))=−13.508 in FIG. 12, both of which are larger values.

In actual application, the coupling between the signals in the AH mode and AH mode can be further reduced by adjusting an overlap between adjacent coil units.

FIG. 13 is a diagram of a structure for simulation of decoupling the eight coil units, as shown in FIG. 1, in a magnetic resonance (MR) system by using a coil unit decoupling apparatus according to an embodiment of the present disclosure. This structure uses a 4× mixed mode to separate H signals from AH signals.

There are four ports in each loop of coil units, and one of the ports is used to connect the coil unit decoupling apparatus provided in the embodiment of the present disclosure. As shown in FIG. 13, ports 3, 7, 11, 15, 21, 25, and 29 are separately used to connect the decoupling apparatus 50 provided in the embodiment of the present disclosure. The other three ports in each loop of coil units are connected to capacitors. As shown in FIG. 13, c1 to c12 correspond to capacitors in a loop of four coil units at the bottom layer, and c13 to c24 correspond to capacitors in a loop of four coil units at the top layer. c1 to c24 are adjusted so that all H signals are tuned to a magnetic resonance (MR) frequency. All the signals have a slight frequency offset due to the Hall effect.

For the eight coil units, there are eight simulation ports, in which four simulation ports (simulation ports T2, T4, T6, and T8 in FIG. 12) are in the H mode, and four simulation ports (simulation ports T1, T3, T5, and T7 in FIG. 12) are in the AH mode.

FIG. 14 shows a simulation result of the structure shown in FIG. 13. It can be seen that there is strong coupling only between the simulation ports T1 and T7 and between T3 and T5 in the AH mode, and the degree of coupling between signals in other modes is lower than 12 dB.

To further reduce the coupling between signals in the AH mode and AH mode, additional cross capacitors c25 and c26 may be added to the structure. In other words, in the coil unit decoupling apparatus 50 provided in the embodiment of the present disclosure, a port for outputting an AH signal may be connected to a fourteenth capacitor to eliminate coupling with other AH signals.

Because AH signals have no signal strength at the center of the entire coil structure, the signal-to-noise ratio at the center of the coil structure is only provided by H signals. Even when there is a need to take complex measures to resolve the problem of coupling between signals in the AH mode and AH mode, the signal-to-noise ratio at the center of the coil structure is not affected, although a signal-to-noise ratio loss may be caused.

FIG. 15 presents a diagram of an application of a coil unit decoupling apparatus according to an embodiment of the present disclosure, which is connected between two coil units. 151 denotes a first phase-shift circuit, 152 denotes a second phase-shift circuit, and 153 denotes a combiner.

The coil unit decoupling apparatus provided in the embodiment of the present disclosure may be placed in front of a preamplifier of the coil units, which will additionally cause a signal-to-noise ratio loss. Generally, the signal-to-noise ratio loss is approximately 0.1 dB to 0.2 dB, which is equivalent to a decrease of 1% to 2% in signal-to-noise ratio. It has been found through tests that, after the use of the coil unit decoupling apparatus provided in the embodiment of the present disclosure, a signal-to-noise ratio loss can be limited to 3.1 dB. Theoretically, a signal-to-noise ratio loss within 3 dB is considered as zero loss. Therefore, it may be considered that, after the use of the coil unit decoupling apparatus provided in the embodiment of the present disclosure, the additional signal-to-noise ratio loss is only 0.1 dB, which is equivalent to a signal-to-noise ratio loss of 1%. It can be seen that, after the use of the coil unit decoupling apparatus provided in the embodiment of the present disclosure, little signal-to-noise ratio loss is caused.

In addition, it should be noted that the standard impedance of a radio frequency circuit is generally 50 Ohms. After the coil unit decoupling apparatus provided in the embodiment of the present disclosure is connected to the coil units, capacitors in a loop of coil units may be first adjusted, so that the impedance of ports in the H mode is tuned to 50 Ohms. At this moment, the impedance of ports in the AH mode may deviate from 50 Ohms. Then, the capacitors are adjusted again to tune the impedance of the ports in the AH mode to 50 Ohms.

The embodiments of the present disclosure further provide an MR system, which includes a coil unit decoupling apparatus 50 as described in any one of the above embodiments.

The beneficial technical effects of the embodiments of the present disclosure are as follows:

I. The coil unit decoupling apparatus provided in the embodiments of the present disclosure has a simple structure, is easily implemented, and has a strong decoupling effect. The coil units may be adjusted systematically without difficulty. For multiple layers of coil units in the magnetic resonance system that are distributed on the surface of the cylinder, the coil units at each layer may have the same layout and may be arranged in the same manner, to achieve the optimal performance of magnetic resonance imaging.

II. There is no need to use a complex copper structure, and the signal-to-noise ratio at the center of the coil structure can be maintained at the optimal value.

III. The coil unit decoupling apparatus provided in the embodiments of the present disclosure is particularly applicable to a low-field system in which a Q factor is high and decoupling is hard to implement.

The above description is merely illustrative of the preferred embodiments of the present disclosure and is not intended to limit the present disclosure. Any modifications, equivalent substitutions, improvements, etc. made within the spirit and principles of the present disclosure shall fall within the scope of protection of the present disclosure.

What is claimed is:

1. A coil unit decoupling circuit, comprising:
a first phase-shift circuit configured to be coupled to a first coil unit in a magnetic resonance system; and
a second phase-shift circuit configured to be coupled to a second coil unit in the magnetic resonance system,
wherein the coil unit decoupling circuit is configured to separate, using a distribution characteristic of a spatial quadrature field between the first coil unit and the second coil unit, a Helmholtz signal and an anti-Helmholtz signal from signals received from the first coil unit and the second coil unit via the first phase-shift circuit and the second phase-shift circuit, respectively, to electromagnetically decouple the first coil unit and the second coil unit from one another.

2. The coil unit decoupling circuit as claimed in claim 1, further comprising:
a combiner, and wherein:
a first connection terminal of the first phase-shift circuit is connected to a first port of the first coil unit;
a second connection terminal of the first phase-shift circuit is connected to a first connection terminal of the combiner;
a second connection terminal of the combiner is connected to a first connection terminal of the second phase-shift circuit;
a second connection terminal of the second phase-shift circuit is connected to a first port of the second coil unit; and
a sum of phase differences between the first phase-shift circuit, the combiner, and the second phase-shift circuit is 180 degrees or −180 degrees.

3. The coil unit decoupling circuit as claimed in claim 2, wherein:
the first phase-shift circuit comprises: a first capacitor, a second capacitor, a first inductor, and a third capacitor,
a first connection terminal of the first capacitor is connected to the first port of the first coil unit;
a second connection terminal of the first capacitor is connected to a first connection terminal of the second capacitor and a first connection terminal of the first inductor;
a second connection terminal of the first inductor is connected to a first connection terminal of the third capacitor;
a second connection terminal of the third capacitor is grounded; and
a second connection terminal of the second capacitor is connected to the first connection terminal of the combiner.

4. The coil unit decoupling circuit as claimed in claim 3, wherein:
the first phase-shift circuit further comprises a fourth capacitor, a fifth capacitor, and a sixth capacitor,
the fourth capacitor is connected in parallel across the first capacitor,
the fifth capacitor is connected in parallel across the second capacitor, and
the sixth capacitor is connected in parallel across the third capacitor.

5. The coil unit decoupling circuit as claimed in claim 4, wherein:
the first phase-shift circuit further comprises a seventh capacitor, and
the fourth capacitor is connected in parallel across the first capacitor,
the fifth capacitor is connected in parallel across the second capacitor, and
the sixth capacitor and the seventh capacitor are respectively connected in parallel across the third capacitor.

6. The coil unit decoupling circuit as claimed in claim 5, wherein:
the second phase-shift circuit comprises an eighth capacitor, a second inductor, and a ninth capacitor,
a first connection terminal of the eighth capacitor is connected to the second connection terminal of the combiner and a first connection terminal of the second inductor;
a second connection terminal of the eighth capacitor is grounded;
a second connection terminal of the second inductor is connected to a first connection terminal of the ninth capacitor and the first port of the second coil unit; and
a second connection terminal of the ninth capacitor is grounded.

7. The coil unit decoupling circuit as claimed in claim 6, wherein:
the second phase-shift circuit further comprises a tenth capacitor and an eleventh capacitor,
the tenth capacitor is connected in parallel across the eighth capacitor, and
the eleventh capacitor is connected in parallel across the ninth capacitor.

8. The coil unit decoupling circuit as claimed in claim 7, wherein:
the combiner comprises a twelfth capacitor, a third inductor, a fourth inductor, and a thirteenth capacitor,
a first connection terminal of the twelfth capacitor is connected to the second connection terminal of the first phase-shift circuit and a first connection terminal of the fourth inductor;
a second connection terminal of the twelfth capacitor is connected to a first connection terminal of the third inductor;
a second connection terminal of the third inductor is connected to a first connection terminal of the thirteenth capacitor and the first connection terminal of the second phase-shift circuit; and
a second connection terminal of the thirteenth capacitor is connected to a second connection terminal of the fourth inductor.

9. The coil unit decoupling circuit as claimed in claim 8, wherein:
a phase difference between the second connection terminal of the twelfth capacitor and the first port of the first coil unit is a first phase difference,
a phase difference between the second connection terminal of the twelfth capacitor and the first port of the second coil unit is a second phase difference, and
a difference between the first phase difference and the second phase difference is 180 degrees or −180 degrees.

10. The coil unit decoupling circuit as claimed in claim 9, wherein:
an attenuation between the second connection terminal of the twelfth capacitor and the first port of the first coil unit is equal to an attenuation between the second connection terminal of the twelfth capacitor and the first port of the second coil unit.

11. The coil unit decoupling circuit as claimed in claim 1, wherein the first coil unit and the second coil unit satisfy the-a condition of being symmetrical with respect to a plane.

12. The coil unit decoupling circuit as claimed in claim 1, wherein a port in the coil unit decoupling circuit that is used for outputting an anti-Helmholtz signal is connected to a capacitor to eliminate coupling with another anti-Helmholtz signal.

13. The coil unit decoupling circuit as claimed in claim 2, wherein:
    the second phase-shift circuit comprises a first capacitor, a first inductor, and a second capacitor,
    a first connection terminal of the first capacitor is connected to the second connection terminal of the combiner and a first connection terminal of the first inductor;
    a second connection terminal of the first capacitor is grounded;
    a second connection terminal of the first inductor is connected to a first connection terminal of the second capacitor and the first port of the second coil unit; and
    a second connection terminal of the second capacitor is grounded.

14. The coil unit decoupling circuit as claimed in claim 13, wherein:
    the second phase-shift circuit further comprises a third capacitor and a fourth capacitor,
    the third capacitor is connected in parallel across the first capacitor, and
    the fourth capacitor is connected in parallel across the second capacitor.

15. The coil unit decoupling circuit as claimed in claim 2, wherein:
    the combiner comprises a first capacitor, a first inductor, a second inductor, and a second capacitor,
    a first connection terminal of the first capacitor is connected to the second connection terminal of the first phase-shift circuit and a first connection terminal of the second inductor;
    a second connection terminal of the first capacitor is connected to a first connection terminal of the first inductor;
    a second connection terminal of the first inductor is connected to a first connection terminal of the second capacitor and the first connection terminal of the second phase-shift circuit; and
    a second connection terminal of the second capacitor is connected to a second connection terminal of the second inductor.

16. The coil unit decoupling circuit as claimed in claim 15, wherein:
    a phase difference between the second connection terminal of the first capacitor and the first port of the first coil unit is a first phase difference,
    a phase difference between the second connection terminal of the first capacitor and the first port of the second coil unit is a second phase difference, and
    a difference between the first phase difference and the second phase difference is 180 degrees or −180 degrees.

17. The coil unit decoupling circuit as claimed in claim 16, wherein:
    an attenuation between the second connection terminal of the first capacitor and the first port of the first coil unit is equal to an attenuation between the second connection terminal of the first capacitor and the first port of the second coil unit.

* * * * *